(12) United States Patent
Krivonak et al.

(10) Patent No.: US 9,648,789 B2
(45) Date of Patent: May 9, 2017

(54) APPARATUS FOR COOLING AND MOUNTING A CIRCUIT BOARD

(71) Applicant: General Electric Company, Schenectady, NY (US)

(72) Inventors: Andrew Louis Krivonak, Lawrence Park, PA (US); Mark Allen Murphy, Erie, PA (US)

(73) Assignee: General Electric Company, Schenectady, NY (US)

( * ) Notice: Subject to any disclaimer, the term of this patent is extended or adjusted under 35 U.S.C. 154(b) by 98 days.

(21) Appl. No.: 14/511,441

(22) Filed: Oct. 10, 2014

(65) Prior Publication Data

US 2016/0105992 A1 Apr. 14, 2016

(51) Int. Cl.
*H05K 7/20* (2006.01)

(52) U.S. Cl.
CPC .................... *H05K 7/209* (2013.01)

(58) Field of Classification Search
CPC ........................ H05K 7/205; H05K 7/20445
USPC .......................................... 361/707; 257/724
See application file for complete search history.

(56) References Cited

U.S. PATENT DOCUMENTS

| | | | | |
|---|---|---|---|---|
| 4,039,900 A * | 8/1977 | Roback | .................. | H05K 7/209 323/280 |
| 4,618,164 A * | 10/1986 | Ryu | ........................ | B60R 22/06 280/804 |
| 4,656,559 A * | 4/1987 | Fathi | ................... | H05K 7/20409 361/721 |
| 5,709,557 A * | 1/1998 | Martin | .................. | H05K 5/0069 361/785 |
| 5,895,974 A * | 4/1999 | Eytcheson | .............. | H01L 25/18 257/107 |
| 7,719,833 B2 * | 5/2010 | Inagaki | ............... | B60R 16/0239 165/80.3 |
| 2006/0267192 A1 * | 11/2006 | Chen | ....................... | G06F 1/181 257/724 |
| 2009/0195976 A1 * | 8/2009 | Chang | .................... | G06F 1/187 361/679.34 |

* cited by examiner

*Primary Examiner* — Dion R Ferguson
*Assistant Examiner* — Mandeep S Buttar
(74) *Attorney, Agent, or Firm* — John A. Kramer; Global Patent Operation

(57) ABSTRACT

An apparatus is provided that includes a housing for an electronic device. The housing includes a plurality of side walls and a removable exterior housing panel. A circuit board is mechanically attached to a first side of the panel, which faces an interior of the housing when the panel is secured to the plurality of side walls. The panel is made from a heat-conductive material to conduct heat from the circuit board to the panel and exterior environment.

17 Claims, 8 Drawing Sheets

APPARATUS FOR COOLING AND MOUNTING A CIRCUIT BOARD

BACKGROUND

Technical Field

Embodiments of the subject matter disclosed herein relate to mounting and cooling a control card for an electronic device.

Discussion of Art

Electronic devices, such as an inverter for converting direct current (DC) to alternating current (AC), can be standalone apparatuses having a corresponding housing and couplings to attach the apparatuses to other systems or devices. Such standalone apparatuses provide some degree of generality or configurability in order to adapt to conditions of other systems. Likewise, given variable conditions or supportive features of the other systems to which such apparatuses are attached, a degree of self-sufficiency is valuable to enhance portability of the apparatuses. Accordingly, apparatuses containing electronic devices (e.g., inverters) often include additional features such as a control card, an external interface to the control card, and a forced convection system for cooling the control card.

In such apparatuses, brackets, clamps, or other supports secure the control card in some configuration within a housing. The external interface, in the form of a connector, for example, is secured externally to the housing. A harness coupling the connector to the control card is threaded through a hole in the housing from the outside during attachment of the connector. Further, the harness can be strained or damaged when a portion of the housing to which the connector is secured is removed to access internals of the electronic device for servicing. Moreover, the forced convention system often includes a fan for air cooling or a pump for liquid cooling to circulate a heat transfer fluid (i.e., coolant). Such structure introduces additional cost for the added components, larger apparatus volume to accommodate the components, and increased power consumption from supplying the fan and/or pump.

BRIEF DESCRIPTION

In an embodiment, an assembly for an apparatus is provided. The assembly includes a panel formed from a heat-conductive material. The panel comprises a panel body that includes a first surface and a second surface separated by a thickness of the panel body. The first surface includes a plurality of fins, and the second surface includes a plurality of protrusions and a rail. The panel further includes a connector mount extending away from the panel body. In addition, the assembly can include a circuit board of an electronic device mechanically attached to the second surface of the panel, a connector mechanically attached to the connector mount, and a wire harness coupling the connector and the circuit board. The wire harness extends, at least partially, along the rail on the second surface.

In another embodiment, an apparatus is provided that includes a housing for an electronic device. The housing includes a plurality of sidewalls and a panel. The panel is a removable exterior housing panel. The apparatus further includes a circuit board mechanically attached to a first side of the panel. The first side of the panel faces an interior of the housing when the panel is attached to the plurality of sidewalls. The panel can be a heat-conductive material to conduct heat from the circuit board to the panel.

In a further embodiment, an apparatus is provided that includes an electronic device and a housing for the electronic device. The housing includes a plurality of sidewalls, a removable front panel, and a removable panel assembly. The removable panel assembly includes a panel of heat-conductive material having a first side and a second side separated by a thickness of the heat-conductive material. The first side includes a connector mount, a plurality of mounting bosses, a plurality of thermal bosses, and a harness rail. The second side includes a plurality of fins. The removable panel assembly further includes a circuit board mechanically attached to the first side of the panel via at least a subset of the plurality of mounting bosses. The plurality of thermal bosses compress a thermal interface material against the circuit board, when attached, to conduct heat from the circuit board to the panel. The removable panel assembly also includes a connector terminal mechanically attached to the connector mount and a wire harness coupling the connector terminal to the circuit board. The wire harness is secured by the harness rail.

BRIEF DESCRIPTION OF THE DRAWINGS

Reference is made to the accompanying drawings in which particular embodiments and further benefits of the invention are illustrated as described in more detail in the description below, in which.

DETAILED DESCRIPTION

Figure 1:
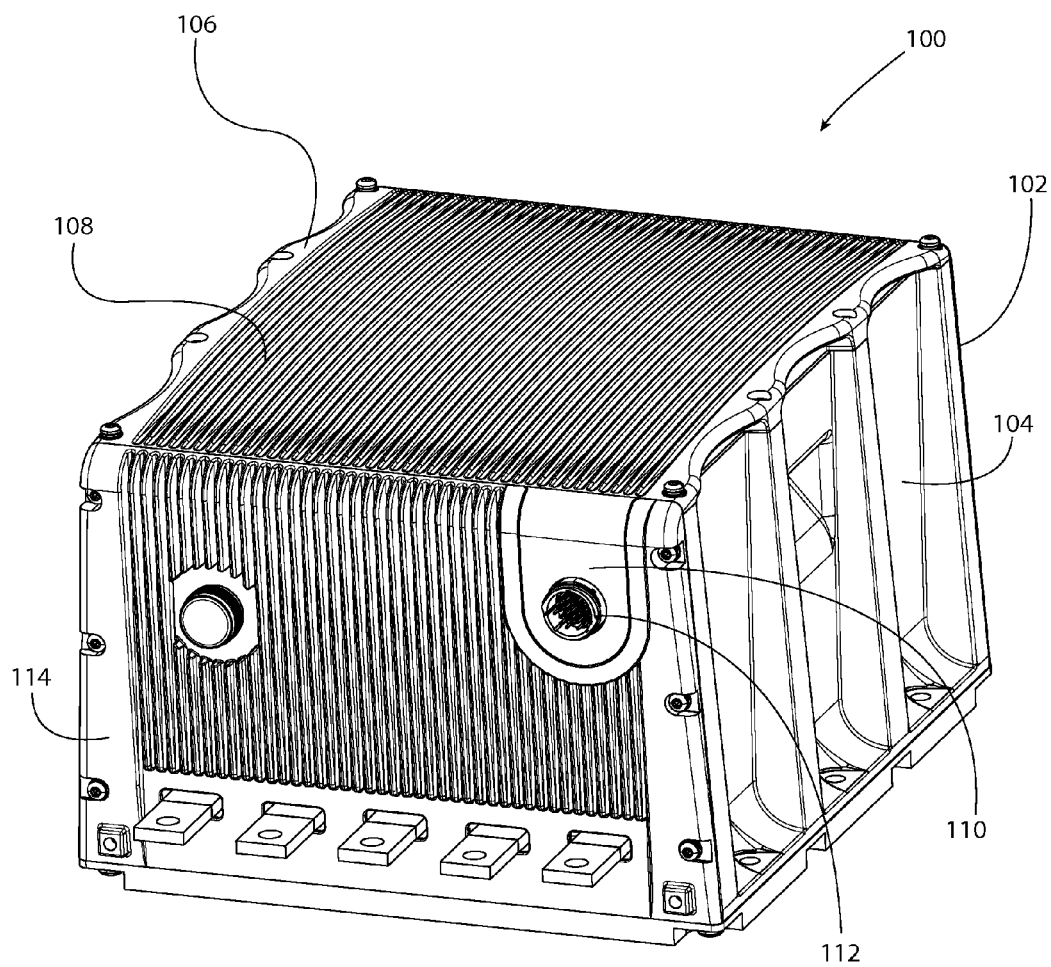
FIG. 1 illustrates an exemplary, non-limiting embodiment of an apparatus according to one or more aspects.

Embodiments described herein generally relate to a structure for mounting and cooling a circuit board for an electronic device. The electronic device, the structure for mounting and cooling the circuit board, and the circuit board itself can be included in an apparatus for controlling the electronic device and interfacing the electronic device with other systems, devices, and/or apparatuses. According to one example, the electronic device is an inverter for converting a direct current input into an alternating current output. Further to this example, the circuit board can be a control card for the inverter that enables control, configuration, or other manipulation of the operation of the inverter.

The mounting and cooling structure can include a panel that further operates as at least a portion of a housing for the electronic device (i.e., the housing of the apparatus that includes the electronic device, control card, etc.). The panel is substantially planar having a first surface and a second surface separated by a thickness of material forming the panel. The first surface and the second surface generally define a first side and a second side, respectively, of the panel. Here, "first" and "second" do not indicate or imply a priority arrangement or any other ranking, standing, position, or status. Rather, these terms are utilized to provide clarity when describing similar objects or features.

According to an example, the panel is made from a heat-conductive material. For instance, the heat-conductive material can be a metal with a high thermal conductivity such as aluminum, copper, silver, gold, tungsten, etc. However, the heat-conductive material can be a metallic heat-conductive alloy, a ceramic with high thermal conductance (e.g., beryllium oxide or the like), a form of carbon (e.g., diamond, diamond-like coating, graphene, etc.), or substantially any other material possessing a thermal conductivity adequate to conduct heat generated within the apparatus. As utilized herein, the term "heat-conductive material" refers to a material having a thermal conductivity sufficient to maintain a temperature of the circuit board within tolerance. That is, the thermal conductivity of the material meets or exceeds a level of heat transfer from the circuit board, electronic device, or other components within the apparatus based on a known or estimated amount of heat generated during operation of the apparatus. The level of heat transfer is established to maintain an operating temperature of the apparatus to within tolerance.

The circuit board is mechanically attached to the panel. More particularly, the circuit board is secured to a side (e.g., the first side) of the panel that faces into an interior of the housing. On the side to which the circuit board is secured, the panel includes one or more protruding features. These features can be integrally formed with the panel and, therefore, also made from the same heat-conductive material. Accordingly, the protruding features and the panel can be machined or molded as a monolithic piece. As utilized herein, the terms "protrusion" or "protruding feature" refer to a portion of an object connected to, but extending away from, a base surface of the object. Here, "base surface" refers to portions of the object, and specifically, portions of the surface of the object at which a reduced thickness of the panel can be observed.

According to an aspect, the protruding features can include one or more mounting bosses and one or more thermal bosses. The mounting bosses, in an example, can include docking sleeves respectively having a relatively flat upper surface for supporting the circuit board and a central, axial aperture for receiving a fastener (e.g., screw, pin, clip, dowel, etc.) for securing the circuit board on the upper surface. The axis of the aperture is generally perpendicular to the surface of the panel. The thermal bosses can be plateaus extending from the base surface of the panel to a height substantially even with a height of the mounting bosses. The thermal bosses compress a thermal interface material positioned between the bosses and the circuit board, when mounted. The thermal interface material draws heat from the circuit board into the panel. The thermal interface material also operates to electrically isolate the circuit board from the thermal bosses, and mitigates mechanical contact stress between the thermal bosses and the circuit board. According to examples, the thermal interface material can include one or more soft, thermally-conductive pads or a thermally-conductive gel. Here, "soft" refers to a material which is readily compressible. The mounting bosses can further operate as additional thermal bosses.

A plurality of fins is provided on a side (e.g., the second side) of the panel, which is a portion of the housing of the apparatus. The fins can be integrally formed with the panel and, thus, can be made of the same heat-conductive material. The fins operate to dissipate heat, conducted into the panel, into an environment.

A connector mount is provided, which is integrally formed with the panel. The connector mount can be provided on a margin or edge of the first side and generally extends away from the first surface. That is, the connector mount generally extends in a same direction as the protruding features extend. In an example, the connector mount is perpendicular with respect to the first surface. Accordingly, when the panel is attached to the housing of the apparatus, the connector mount forms a portion of a side panel, a front panel, or a back panel of the housing. A connector or a terminal is mechanically attached to the connector mount.

Also included in the protruding features of the first side is a harness rail. The harness rail guides and secures a wire harness coupling the connector to the circuit board. The harness rail, in an example, includes a set of holes or clips by which the wire harness is fastened. For instance, the wire harness can be secured with cable ties threaded through apertures along the rail.

The mounting and cooling structure, the circuit board, the connector, and the wire harness can form an assembly that collectively can be mechanically attached to other parts of the apparatus as a single entity. For instance, the assembly, as a unit, can be attached to sidewalls of the housing of the apparatus. Accordingly, the assembly is a self-contained structure that can be separately and independently constructed from a remainder of the apparatus. That is, the panel, the circuit board, the connector, and the wire harness can be separately assembled to form a self-contained unit. The self-contained unit can be assembled with the remainder of the apparatus (e.g., the electronic device, other housing panels, etc.). After connection to the electronic device installed within the housing, a cover can be attached. The cover forms a remainder of the housing panel of which the connector mount of the assembly is a portion. While the cover can physically contact the connector mount, the cover is not mechanically coupled or attached thereto. Accordingly, removal or attachment of the cover does not disturb the connector mount, the connector, the wire harness, or any other portion of the assembly. That is, despite being positioned on an accessible face of the apparatus, the connector and the wire harness remain intact and connected whenever the housing of the apparatus is opened.

As utilized herein, the term "assembly" refers to one or more parts constructed together to form an aggregate piece. The aggregate piece is generally self-contained and handled as a single unit, piece, or part. For instance, the aggregate piece can be a constituent part for another assembly or apparatus.

In one embodiment, an assembly for an apparatus is described. The assembly includes a panel formed from heat-conductive material. The panel can include panel body having a first surface and a second surface separated by a thickness of the panel body. The first surface includes a plurality of fins and the second surface includes a plurality of protrusions and a rail. The panel further includes a connector mount extending away from the panel body. In addition, the assembly includes a circuit board of an electronic device mechanically attached to the second surface of the panel body, a connector mechanically attached to the connector mount, and a wire harness coupling the connector and the circuit board. The wire harness, according to an aspect, at least partially extends along the rail on the second surface.

According to one example, the assembly can include a set of fasteners securing the wire harness to the rail. According to another example, the panel operates as a portion of a housing of the apparatus. When secured as part of the housing, the first surface forms part of an exterior surface of the apparatus and the second surface forms part of an interior surface of the apparatus.

In another example, the plurality of protrusions includes a set of mounting bosses and a set of thermal bosses. The circuit board is mechanically attached to the second surface of the panel via attachment to the set of mounting bosses. The set of thermal bosses compress a thermal interface material against the circuit board to conduct heat from the circuit board to the panel. Still further, according to an additional example, the connector mount extends perpendicularly from the panel body.

According to another embodiment, an apparatus is described that includes a housing for an electronic device. The housing includes at least a plurality of sidewalls and a panel. The panel is a removable exterior housing panel. The apparatus further includes a circuit board mechanically attached to a first side of the panel. The first side faces an interior of the housing when the panel is secured to the plurality of sidewalls. The panel is a heat-conductive material to conduct heat from the circuit board to the panel. In an embodiment, the electronic device is an inverter or other power converter, and the circuit board is a control card (controller) of the inverter or other power converter.

In an example, the apparatus includes a plurality of fins on a second side of the panel to dissipate heat into an environment. The second side is an exterior side of the housing. The apparatus can also include a set of mounting bosses and a set of thermal bosses provided on the first side of the panel. The set of mounting bosses and the set of thermal bosses are formed integrally with the panel, and are of the heat-conductive material. According to one example, the heat-conductive material of the panel is aluminum.

In a further example, the apparatus includes a connector terminal accessible externally from the housing and a connector mount for mounting at least the connector terminal. The connector mount is an integral extension of the panel and perpendicularly arranged with respect to the first side of the panel. The apparatus, according to this example, also includes a wire harness coupling the connector terminal to the circuit board. The first side of the panel further includes a rail for securing the wire harness.

In yet another embodiment, an apparatus is described that include an electronic device and a housing for the electronic device. The housing includes a plurality of sidewalls, a removable front panel, and a removable panel assembly. The removable panel assembly can include a panel of heat conductive material having a first side and a second side separated by a thickness of the heat-conductive material. The first side includes a connector mount, a plurality of mounting bosses, a plurality of thermal bosses, and a harness rail. The second side includes a plurality of fins. The removable panel assembly can also include a circuit board mechanically attached to the first side of the panel via a subset of the plurality of mounting bosses. The plurality of thermal bosses compress a thermal interface material against the circuit board, when attached, to conduct heat from the circuit board to the panel. The removable panel assembly also includes a connector terminal mechanical attached to the connector mount and a wire harness coupling the connector terminal to the circuit board. The wire harness is secured to the harness rail.

According to an example of the foregoing embodiment, the electronic device can be an inverter and the circuit board is a control card of the inverter. In another example, the removable front panel and the removable panel assembly are separately secured to the plurality of sidewalls.

With reference to the drawings, like reference numerals designate identical or corresponding parts throughout the several views. However, the inclusion of like elements in different views does not mean a given embodiment necessarily includes such elements or that all embodiments of the invention include such elements. Moreover, terms of location (e.g., back, front, top, etc.) are utilized in the following description, but are not intended to be limiting. The terms of location are utilized to distinguish various features as illustrated according to perspectives depicted in the drawings.

FIG. 1 illustrates an exemplary, non-limiting embodiment of an apparatus 100 having a housing 102. In the embodiment, the housing 102 includes a pair of side walls 104 opposing one another, a top panel 106, and a front panel 114. The housing 102 can further include a back panel and a bottom panel, which are not shown in the figure.

Viewed externally, as with FIG. 1, the apparatus 100 includes a connector mount 110 integrally and continuously formed with the top panel 106. That is, the apparatus 100 includes a panel having a panel body (i.e., the top panel 106) and the connector mount 110 is attached to the panel body. For instance, the connector mount 110 and the top panel 106 can be molded, machined, or otherwise manufactured as one piece. The connector mount 110, though integrated with the top panel 106, extends perpendicularly with respect to the top panel 106 and, thus, forms a portion of a front face of the apparatus 100. The front panel 114 substantially forms a remainder of the front face.

Figure 2:
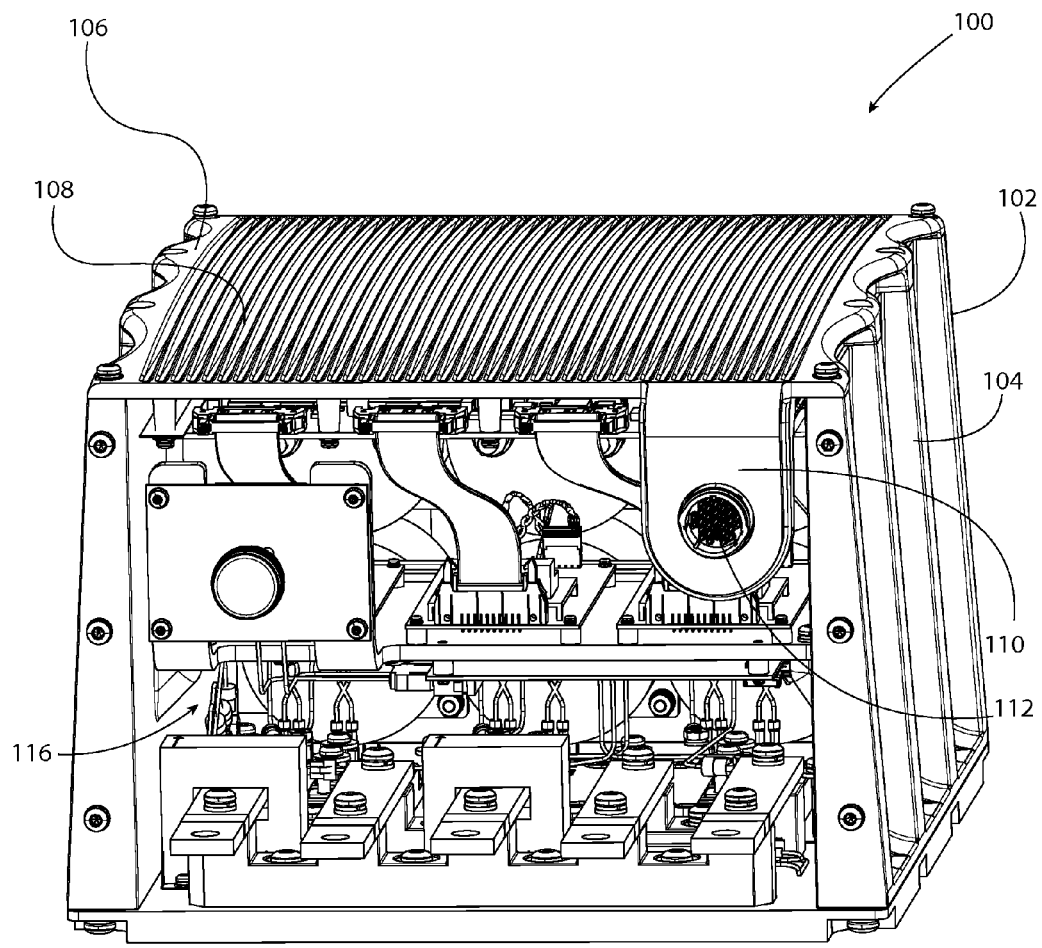
FIG. 2 illustrates the apparatus of FIG. 1 with a panel removed according to one or more aspects.

A connector 112 (also referred to herein as a "terminal") is operably attached to the connector mount 110 so as to be accessible externally from the apparatus 100. The connector mount 110, being integrally and/or continuously formed with the top panel 106, enables removal of the front panel 114 without affecting the connector 112 as shown in FIG. 2. FIG. 2 illustrates the apparatus 100 with the front panel 114 removed. As depicted, the front panel 114 is removed to enable access to internal components of the apparatus 100 and, specifically, an electronic device 116, which can be an inverter. The front panel 114 is removed without disconnection or translation of the connector 112 from the connector mount 110. The connector 112 remains undisturbed and operable following the removal of the front panel 114.

The top panel 106, on an exterior surface with respect to the electronic device 100, includes a plurality of fins 108. The fins 108 increase heat transfer from the apparatus 100 to an environment by increasing a surface area of the exterior surface to promote increased heat dissipation. Grooves can be created on the exterior surface of the top panel 106 such that fins 108 are formed between the grooves. Alternatively, the fins 108 can be molded integrally with the top panel 106 and, thus, formed without removal of material.

Figure 3:
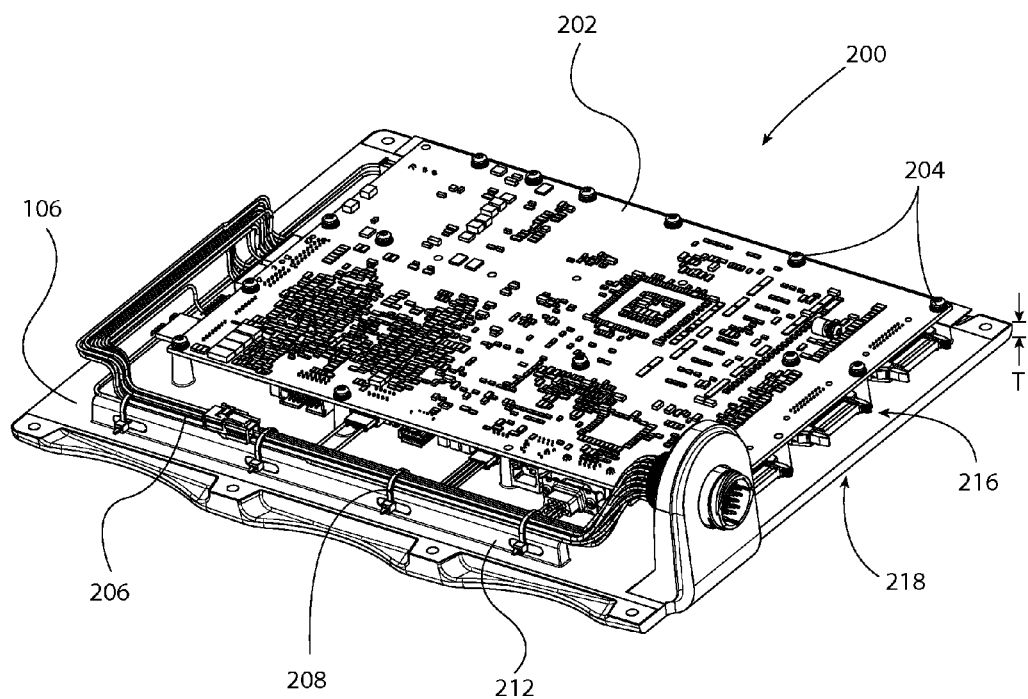
FIGS. 3, 4, and 5 are illustrations of an exemplary, non-limiting embodiment of an assembly for the apparatus of FIG. 1 according to one or more aspects.
Figure 4:
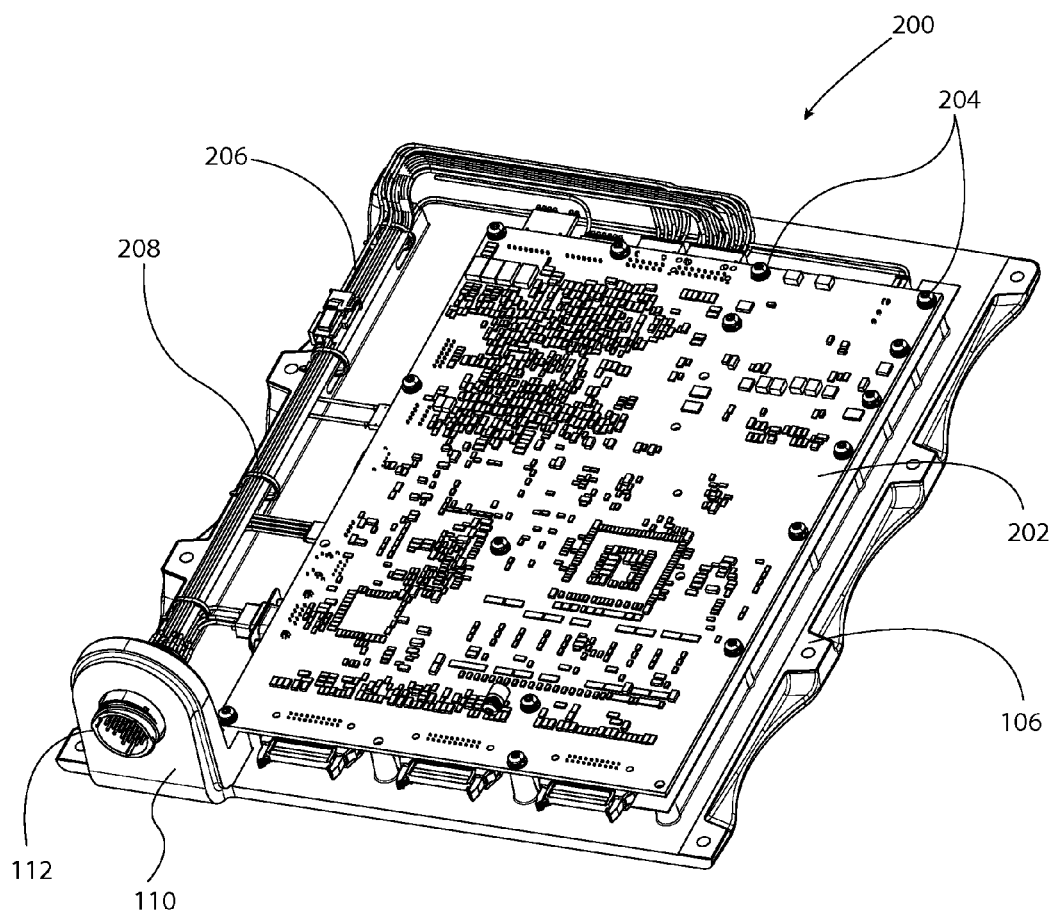
Figure 5:
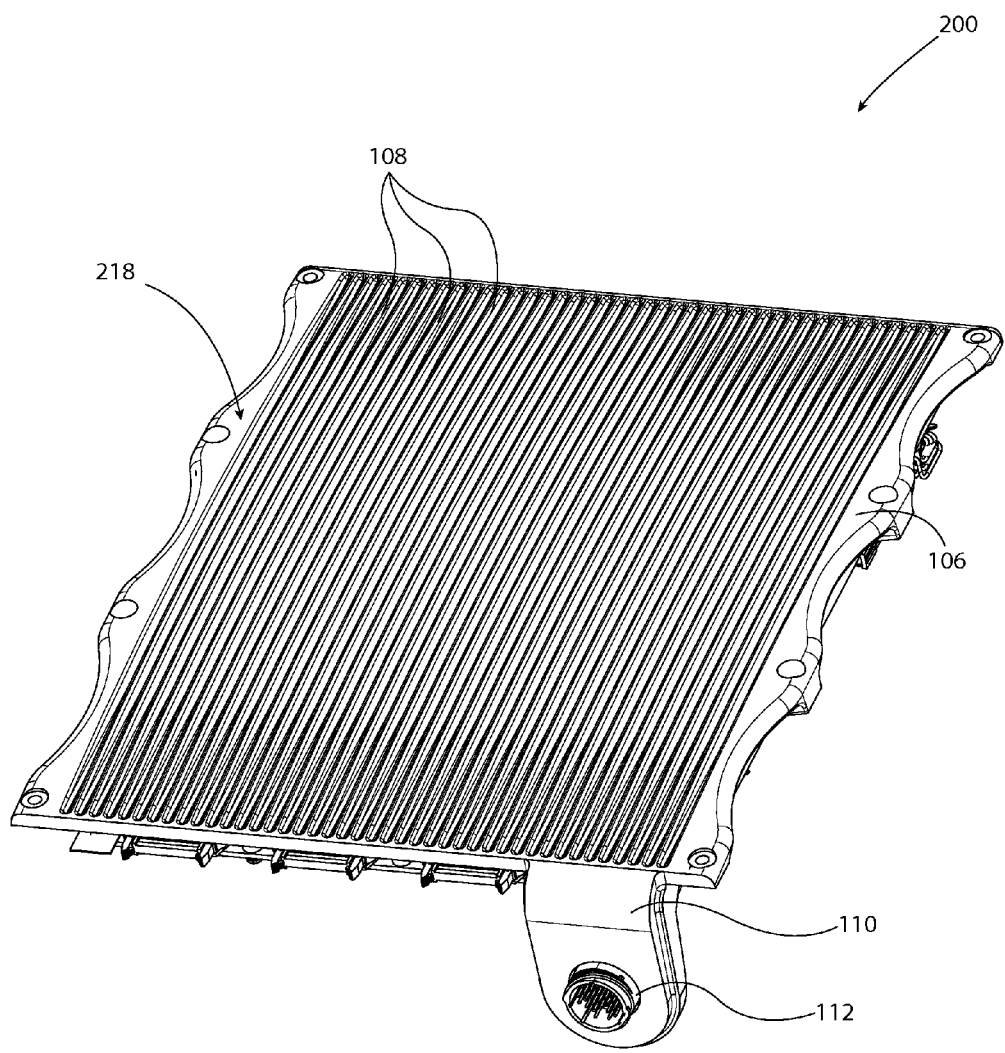

FIGS. 3, 4, and 5 illustrate a non-limiting, exemplary embodiment of an assembly 200. As shown best in FIGS. 3 and 4, the assembly 200 includes the top panel 106, the connector 112, and the connector mount 110, as described above. The assembly 200 further includes a circuit board 202. The circuit board 202 is mounted to the top panel 106 by a plurality of fasteners 204. The fasteners 204 retain the circuit board 202 to a first surface 216 of the top panel 106 which is separated from a second surface 218 by thickness (T) of material of the top panel 106. The first surface 216 can also be referred to as an interior surface of apparatus 100 in that the first surface 216 faces an interior of housing 102 when the assembly 200 is attached to side walls 104 as shown in FIGS. 1 and 2. The second surface 218 is a surface of the top panel 106 on which fins 108 are disposed as shown in FIG. 5. Accordingly, the second surface 218 faces into the environment and can also be referred to as an exterior surface. The fasteners 204 can be screws, bolts, clips, or substantially any device suitable to join the circuit board 202 to the top panel 106.

As arranged in FIGS. 3 and 4, the circuit board 202 is in thermal communication with the top panel 106. Through the first surface 216 of the top panel 106, the thickness T of the top panel 106, and the fins 108, the circuit board 202 is also in thermal communication with the environment. Accordingly, heat generated through operation of the circuit board 202 is dissipated into the environment via the top panel 106 and fins 108. That is, the generated heat is conducted through the top panel 106 to be dissipated via fins 108.

Connector 112 is operatively coupled to the circuit board 202 via a plurality of wires collectively forming a harness 206. The harness 206 is secured to a rail 212 via one or more straps 208. In an example, straps 208 can be cable ties or tie-wraps. Guided by rail 212, the harness 206 is routed between the connector 112 and the circuit board 202 so to be undisturbed by the removal of front panel 114 as shown in FIG. 2. In addition, the harness 206, secured to rail 212 via straps 208, facilitates handling and attachment of the assembly 200 without stress or damage to harness 206, individual wires thereof, and/or connector 112. Further, the assembly 200 can be separately manufactured from apparatus 100 to form a self-contained part or unit.

Figure 6:
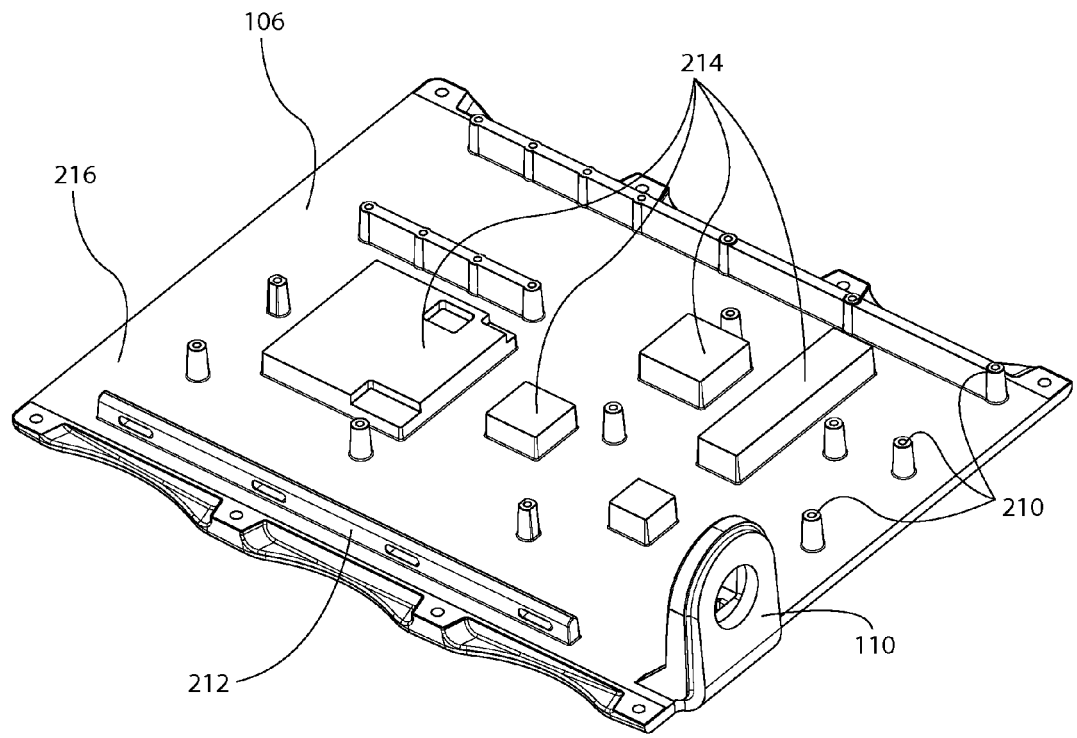
FIGS. 6, 7, and 8 are illustrations of an exemplary, non-limiting embodiment of a panel of the assembly of FIGS. 3, 4, and 6 in accordance with one or more aspects.
Figure 7:
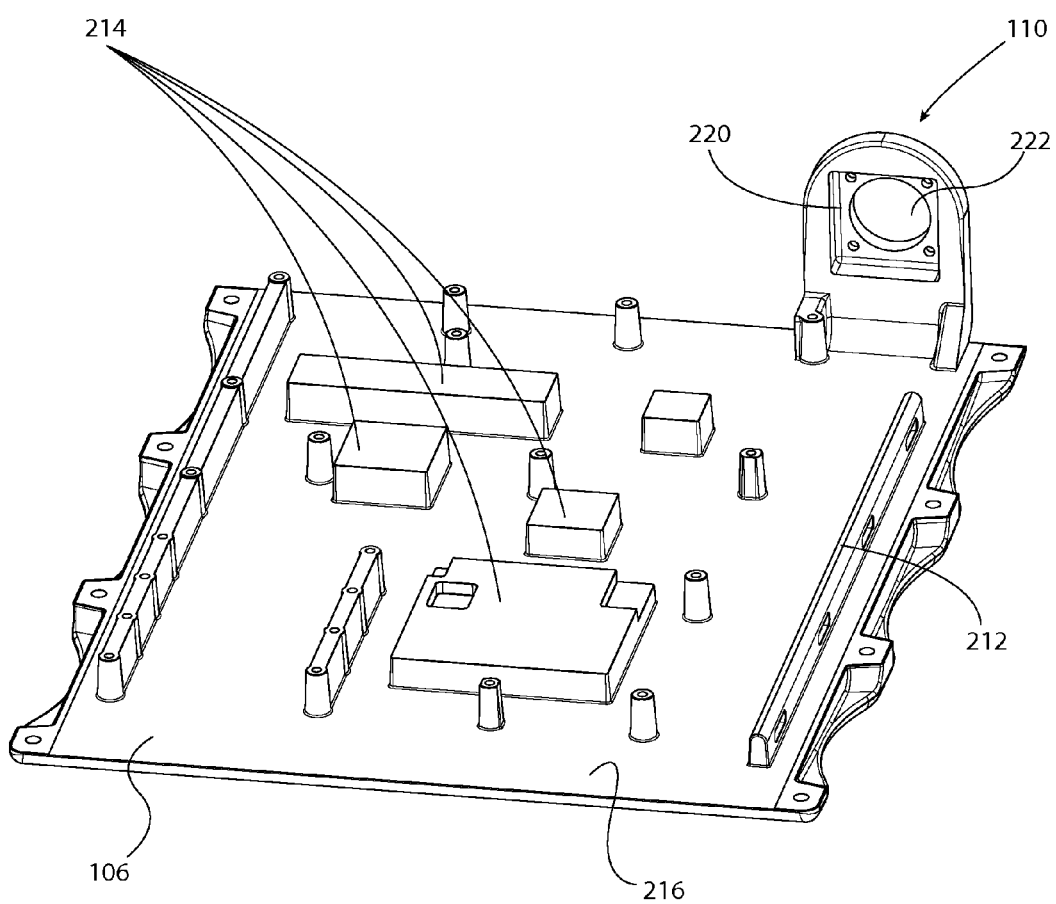
Figure 8:
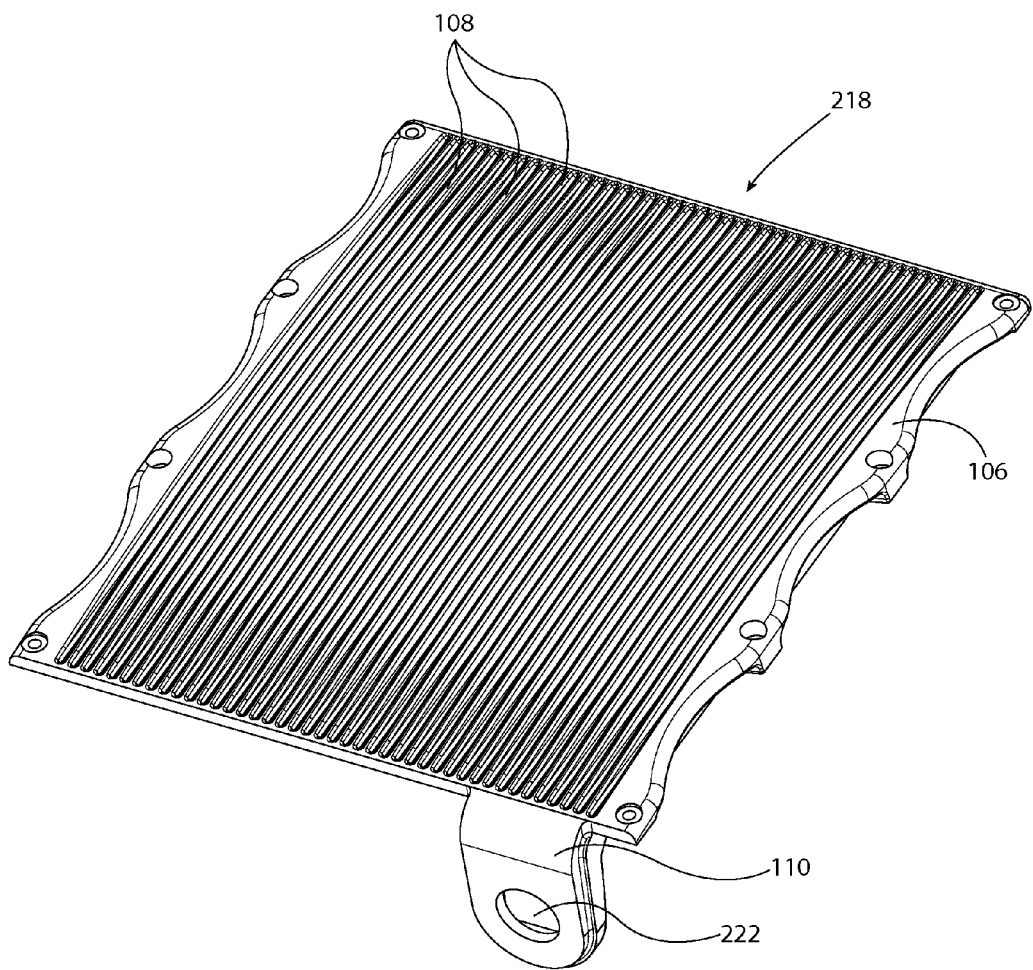

Turning now to FIGS. 6, 7, and 8, the top panel 106 is illustrated according to a non-limiting, exemplary embodiment. On the first surface 216 (i.e., the surface opposite the surface having fins 108), the top panel 106 includes one or more protruding features. Among these protrusions are one or more mounting bosses 210 for securing circuit board 202. The mounting bosses 210 include docking sleeves (i.e., openings or apertures) configured to receive fasteners 204 when attaching circuit board 202 to the top panel 106. A number and arrangement of the mounting bosses 210 can correspond to a design of the circuit board 202. That is, the mounting bosses 210 align to openings positioned on the circuit board 202, which are configured to receive fasteners 204. Alternatively, the mounting bosses 210 can conform to a standard placement (i.e. industry standard or convention) and a particular subset of mounting bosses 210 utilized for securing the circuit board 202 can be determined by the design of circuit board 202. The subset can include any number of mounting bosses 210 up to an entirety of mounting bosses 210 provided on the top panel 106.

Also included among the protruding features are one or more thermal bosses 214. The thermal bosses 214, upon attachment of circuit board 202, are in thermal communication with the circuit board 202 and conduct generated heat into the material of the top panel 106. The conducted heat is dissipated into the environment via fins 108 as described previously. The thermal bosses 214 compress a thermal interface material (not shown) against the circuit board 202. The thermal interface material can be thermally-conductive pads or gel, which operates to conduct heat from the circuit board 202 to the top panel 106, but also electrically isolates the circuit board 202 from the top panel 106 and reduces mechanical contact stress between the circuit board 202 and the thermal bosses 214.

In an example, the arrangement of the thermal bosses 214 on the interior surface can correspond to the design of the circuit board 202. For instance, the thermal bosses 214 can be positioned to correspond to locations of the circuit board 202 at which integrated circuits, capacitors, resistors, and other heat generating elements are mounted. Specifically, the thermal bosses 214 can compress the thermal interface material against the circuit board 202 at an underside surface opposite a surface on which elements of the circuit board 202 are mounted.

The connector mount 110 includes an aperture 222 through which the connector 112 is threaded to become exposed externally from apparatus 100. As shown in FIG. 7, a depression 220 surrounds the aperture 222. A shape of depression 220 generally corresponds to a flange (not shown) of connector 112 so as to receive the flange when the connector 112 is attached to the connector mount 110. While depicted on an interior side of the connector mount 110, the depression 222 can be located on an exterior side of the connector mount 110 (shown without depression in FIG. 8).

In embodiments, a panel comprises (i) a panel body with a first side and a second side, (ii) a set of mounting bosses and a set of thermal bosses attached to the first side of the panel body, and (iii) plural heat sink fins on the second side. The panel is configured to serve as a wall of a housing, such that when the panel is attached to sidewalls of the housing, the first side faces inwards towards an interior of the housing and the second side, with the fins, faces external to the housing and is an external wall of the housing. A circuit board is mechanically connected to the mounting bosses (or some subset thereof) by way of plural fasteners, and thereby to the panel body. The thermal bosses are configured to conduct heat from the circuit board to the panel body and thereby to the fins. It may be the case that the circuit board is not attached to the thermal bosses with fasteners. A total area of contact between the circuit board and the thermal bosses is greater than a total area of contact between the circuit board and the mounting bosses, and/or a degree of thermal transfer from the circuit board to the thermal bosses is greater than a degree of thermal transfer from the circuit board to the mounting bosses, and/or the thermal bosses align with areas on the circuit board that are at a higher temperature than other areas (not aligned with the thermal bosses) of the circuit board during at least one active operational mode (i.e., not turned off) of the circuit board. In embodiments, the housing and circuit board are part of an inverter or other power converter.

In the specification and claims, reference will be made to a number of terms that have the following meanings. The singular forms "a", "an" and "the" include plural referents unless the context clearly dictates otherwise. Approximating language, as used herein throughout the specification and claims, may be applied to modify a quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Moreover, unless specifically stated otherwise, a use of the terms "first," "second," etc., do not denote an order or importance, but rather the terms "first," "second," etc., are used to distinguish one element from another.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be."

This written description uses examples to disclose the invention, including the best mode, and also to enable one of ordinary skill in the art to practice the invention, including making and using a devices or systems and performing incorporated methods. The patentable scope of the invention is defined by the claims, and may include other examples that occur to one of ordinary skill in the art. Such other examples are intended to be within the scope of the claims if they have structural elements that do not differentiate from the literal language of the claims, or if they include equivalent structural elements with insubstantial differences from the literal language of the claims.

What is claimed is:

1. An assembly for an apparatus, comprising: a panel formed from heat-conductive material, comprising: a panel body having a first surface and a second surface separated by a thickness of the panel body, wherein the first surface includes a plurality of fins, and the second surface includes a plurality of protrusions and a rail; and a connector mount extending away from the panel body in a direction perpendicular to the second surface and wherein the connector mount defines an opening for insertion of a connector in an insertion direction that is generally parallel to the second surface of the panel body; and a circuit board of an electronic device mechanically attached to the second surface of the panel; a connector mechanically attached to the connector mount; and a wire harness coupling the connector and the circuit board, wherein the wire harness at least partially extends along the rail on the second surface.

2. The assembly of claim 1, wherein the panel operates as a portion of a housing of the apparatus.

3. The assembly of claim 2, wherein, when secured as part of the housing, the first surface forms part of an exterior surface of the apparatus and the second surface forms part of an interior surface of the apparatus.

4. The assembly of claim 1, wherein the plurality of protrusions includes a set of mounting bosses and a set of thermal bosses.

5. The assembly of claim 4, wherein the circuit board is mechanically attached to the second surface of the panel via attachment to the set of mounting bosses.

6. The assembly of claim 4, wherein the set of thermal bosses physically compress a thermal interface material against the circuit board to conduct heat from the circuit board to the panel.

7. The assembly of claim 1, further comprising a set of fasteners securing the wire harness to the rail.

8. The assembly of claim 1, wherein:
the panel operates as a portion of a housing of the apparatus, and when secured as part of the housing, the first surface forms part of an exterior surface of the apparatus and the second surface forms part of an interior surface of the apparatus; and
the plurality of protrusions includes a set of mounting bosses and a set of thermal bosses, the circuit board being mechanically attached to the second surface of the panel via attachment to the set of mounting bosses, and the set of thermal bosses physically compress a thermal interface material against the circuit board to conduct heat from the circuit board to the panel.

9. An apparatus, comprising:
a housing for an electronic device, the housing having at least a plurality of sidewalls and a panel, the panel being a removable exterior housing panel;
a circuit board mechanically attached to a first side of the panel, the first side facing an interior of the housing when the panel is secured to the plurality of sidewalls;
a connector mount for mounting at least a connector terminal, and the connector terminal, the connector terminal extending into the connector mount in a direction substantially parallel to a surface defined by the first side of the panel and perpendicular to the connector mount,
wherein the panel is a heat-conductive material to conduct heat from the circuit board to the panel,
the connector mount extends away from the panel in a direction perpendicular to the first side, and
the connector terminal is accessible externally from the housing for insertion of a connector in an insertion direction that is generally parallel to the surface defined by the first side of the panel.

10. The apparatus of claim 9, further comprising a plurality of fins on a second side of the panel to dissipate heat into an environment, the second side is an exterior side of the housing.

11. The apparatus of claim 9, further comprising a set of mounting bosses and a set of thermal bosses provided on the first side of the panel, wherein the circuit board is mechanically attached to the first side of the panel via attachment to the set of mounting bosses.

12. The apparatus of claim 11, wherein the set of mounting bosses and the set of thermal bosses are formed integrally with the panel, and are of the heat-conductive material.

13. The apparatus of claim 9, further comprising a wire harness coupling the connector terminal to the circuit board, wherein the first side of the panel further includes a rail for securing the wire harness.

14. The apparatus of claim 9, wherein the connector mount is an integral extension of the panel.

15. An apparatus, comprising: an electronic device; and a housing for an electronic device, the housing having at least a plurality of sidewalls, a removable front panel, and a removable panel assembly; wherein the removable panel assembly includes: a panel of heat conductive material having a first side and a second side separated by a thickness of the heat-conductive material, wherein the first side includes a connector mount that extends away from the panel in a direction perpendicular to the first side, a plurality of mounting bosses, a plurality of thermal bosses, and a harness rail, and the second side includes a plurality of fins; a circuit board mechanically attached to the first side of the panel via at least a subset of the plurality of mounting bosses, the plurality of thermal bosses compress a thermal interface material against the circuit board, when attached, to conduct heat from the circuit board to the panel; a connector terminal mechanically attached to the connector mount; and a wire harness coupling the connector terminal to the circuit board, the wire harness being secured to the harness rail; and wherein the connector mount and the connector terminal define an opening for insertion of a connector in an insertion direction that is generally parallel to a surface defined by the first side of the panel.

16. The apparatus of claim 15, wherein the electronic device is an inverter and the circuit board is a control card of the inverter.

17. The apparatus of claim 15, wherein the removable front panel and the removable panel assembly are separately secured to the plurality of sidewalls.

* * * * *